United States Patent
Shih et al.

(10) Patent No.: US 9,018,087 B2
(45) Date of Patent: Apr. 28, 2015

(54) METHOD OF FABRICATING SEMICONDUCTOR DEVICE

(71) Applicant: United Microelectronics Corp., Hsinchu (TW)

(72) Inventors: Hung-Lin Shih, Hsinchu (TW); Chun-Yuan Wu, Yunlin County (TW); Chin-Fu Lin, Tainan (TW); Chih-Chien Liu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 92 days.

(21) Appl. No.: 14/013,429

(22) Filed: Aug. 29, 2013

(65) Prior Publication Data

US 2015/0064896 A1 Mar. 5, 2015

(51) Int. Cl.
*H01L 21/00* (2006.01)
*H01L 21/28* (2006.01)
*H01L 21/306* (2006.01)
*H01L 21/02* (2006.01)

(52) U.S. Cl.
CPC .... *H01L 21/28141* (2013.01); *H01L 21/30621* (2013.01); *H01L 21/0217* (2013.01); *H01L 21/02164* (2013.01)

(58) Field of Classification Search
CPC ............... H01L 21/02164; H01L 21/0217; H01L 21/02263; H01L 21/30621
See application file for complete search history.

(56) References Cited

U.S. PATENT DOCUMENTS

| 6,583,012 | B1* | 6/2003 | Buynoski et al. ............ 438/275 |
| 7,732,344 | B1* | 6/2010 | Tsai et al. ............. 438/734 |
| 8,361,338 | B2 | 1/2013 | Wang |
| 8,372,719 | B2 | 2/2013 | Wang et al. |

FOREIGN PATENT DOCUMENTS

JP 2013021262 1/2013

* cited by examiner

*Primary Examiner* — Richard Booth
(74) *Attorney, Agent, or Firm* — J.C. Patents

(57) ABSTRACT

Provided is a method of fabricating a semiconductor device including the following steps. A dummy gate structure is formed on a substrate, wherein the dummy gate structure includes a dummy gate and a stacked hard mask, and the stacked hard mask includes from bottom to top a first hard mask layer and a second hard mask layer. A spacer is formed on a sidewall of the dummy gate structure. A mask layer is formed on the substrate. An opening corresponding to the second hard mask layer is formed in the mask layer. The second hard mask layer is removed. The mask layer is removed. A dry etch process is performed to remove the first hard mask layer, wherein the dry etch process uses $NF_3$ and $H_2$ as etchants.

17 Claims, 5 Drawing Sheets

METHOD OF FABRICATING SEMICONDUCTOR DEVICE

BACKGROUND

1. Technical Field

The present invention relates to a method of fabricating a semiconductor device.

2. Description of Related Art

Metal oxide semiconductor field effect transistor (MOSFET) is a basic structure widely applied to various semiconductor devices such as memory devices, image sensors, and display devices. To meet the demand of lighter, thinner, and smaller electronic devices, the size of CMOS is continuously shrunk. Accompanying the miniaturization, however, the fabrication difficulties become prominent. Many issues have emerged and various fabrication techniques should therefore be carefully used and creatively modified.

SUMMARY

The present invention is to provide a method of fabricating a semiconductor device with better morphology.

The invention provides a method of fabricating a semiconductor device including the following steps. A dummy gate structure is formed on a substrate, wherein the dummy gate structure includes a dummy gate and a stacked hard mask, and the stacked hard mask includes from bottom to top a first hard mask layer and a second hard mask layer. A spacer is formed on a sidewall of the dummy gate structure. A mask layer is formed on the substrate. An opening is formed in the mask layer, wherein the opening corresponds to the second hard mask layer. A portion of the mask layer, the second hard mask layer of the first dummy gate structure, and the second hard mask layer of the second dummy gate structure are removed. The remaining portion of mask layer is removed. A dry etch process is performed to remove the first hard mask layer, wherein the dry etch process uses $NF_3$ and $H_2$ as etchants.

In an embodiment, the flow ratio of $NF_3$ and $H_2$ is adjusted in the dry etch process so that a remove rate of the first hard mask and the spacer can be adjusted to be substantially the same.

In an embodiment, the first hard mask layer includes silicon nitride.

In an embodiment, the dry etch process includes a first step and a second step, and the temperature of the second step is higher than the temperature of the first step.

In an embodiment, the temperature of the first step is less than 50° C. and the temperature of the second step is higher than 100° C.

In an embodiment, the mask layer includes photoresist.

The present invention further provides a method of fabricating a semiconductor device including the following steps. A substrate including a first region and a second region is provided. A first dummy gate structure is formed on the first region of the substrate and a second dummy gate structure is formed on the second region of the substrate, wherein the first dummy gate structure and the second dummy gate structure each include a dummy gate and a stacked hard mask, and the stacked hard mask includes from bottom to top a first hard mask layer and a second hard mask layer. A first spacer is formed on a sidewall of the first dummy gate structure and a second spacer is formed on a sidewall of the second dummy gate structure. A mask layer is formed on the substrate to cover the first region and the second region. An opening is formed in the mask layer, wherein the opening corresponds to the second hard mask layer of the first dummy gate structure. A portion of the mask layer is removed to expose the second hard mask layer of the second dummy gate structure. The second hard mask layer of the first dummy gate structure and the second hard mask layer of the second dummy gate structure is removed. The mask layer is removed. A dry etch process is performed to remove the first hard mask layer of the first dummy gate structure and the first hard mask layer of the second dummy gate structure, wherein the dry etch process uses $NF_3$ and $H_2$ as etchants.

In an embodiment, before the formation of the mask layer, the method of fabricating a semiconductor device further includes the following steps. A salicide block layer (SAB) is formed on the first region of the substrate. A salicide layer is formed in the second region of the substrate. The salicide block layer and a portion of the second spacer are removed later.

In an embodiment, the second region is an N-doped region, and the method of fabricating a semiconductor device further includes forming a stress-generating layer comprising SiGe in the second region.

In an embodiment, the second region is a P-doped region, and the method of fabricating a semiconductor device further includes forming a stress-generating layer comprising SiP or SiC in the second region.

Accordingly, the present invention provides a method of fabricating a semiconductor device, in which a hard mask layer and a portion of the spacer adjacent thereto are removed by a specific plasma etch process which can be adjusted to provide a uniform remove rates for different materials, thus resulting a better morphology and, in turn, an improved performance.

In order to make the aforementioned and other objects, features and advantages of the present invention comprehensible, several non-limiting embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
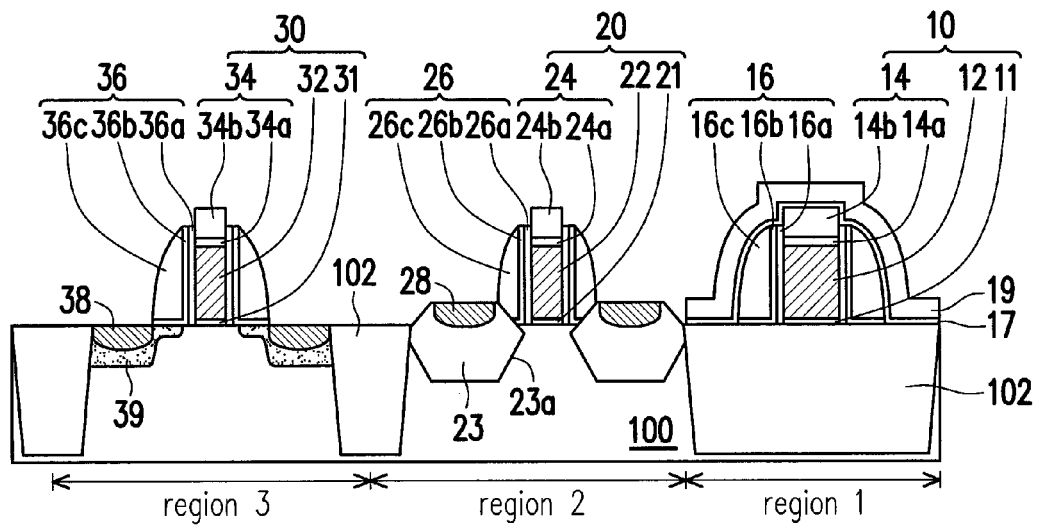
FIGS. 1A-1I are schematic cross-section views illustrating the method of fabricating a semiconductor device according to the first embodiment of the present invention.

Reference will now be made in detail to the embodiments of the invention, examples of which are illustrated in the accompanying drawings. Wherever possible, the same reference numerals are used in the drawings and the description to refer to the same elements.

FIGS. 1A-1I are schematic cross-section views illustrating the method of fabricating a semiconductor device according to an embodiment of the present invention.

Referring to FIG. 1A, a substrate 100 such as a silicon substrate, a silicon-containing substrate, or a silicon-on-insulator (SOI) substrate is provided. The substrate 100 has a region 1, a region 2, and a region 3 disposed therein. The region 1 is a "SAB area" which will be described later. An isolation structure 102 such as shallow trench isolation (STI) is formed in the substrate 100 between the region 2 and the region 3, providing electrical isolation therebetween. In this embodiment, the region 2 is an N-doped region and the region 3 a P-doped region. In the subsequent fabrication process, a P-MOS can be formed in the region 2, and an N-MOS in the region 3.

Dummy gate structures 10, 20, and 30 are formed, respectively, on the region 1, the region 2, and the region 3. The components and the arrangement thereof of these three dummy gate structures are quite similar to each other, and therefore, only one of them (i.e., dummy gate structure 10) is described in specific detail hereinafter. The dummy gate structure 10 includes, from bottom to top, a gate dielectric layer 11, a dummy gate 12, and a stacked hard mask 14, wherein the stacked hard mask 14 includes a first hard mask layer 14a and a second hard mask layer 14b. The gate dielectric layer 11 may include silicon oxide ($SiO_2$) or a high-k material with a dielectric constant greater than 4. The high-k material with a dielectric constant greater than 4 can be metal oxide, such as rare earth metal oxide. Specifically, the high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Additionally, an interfacial layer (not shown) can be formed between the gate dielectric layer 11 and the substrate 100. The interfacial layer may include silicon oxide.

The dummy gate 12 may include polysilicon, and the first hard mask layer 14a and the second hard mask layers 14b may include silicon nitride and silicon oxide, respectively. A spacer 16 with multi-layer structure is formed on a side wall of the dummy gate structure 10 and includes a first spacer layer 16a, a second spacer layer 16b, and a third spacer layer 16c. In an embodiment, the first spacer layer 16a may include SiCN or silicon oxide; the second spacer layer 16b may include silicon oxide; the third spacer layer 16c may include silicon nitride. The present invention, however, is not limited thereto; in other embodiments, it is possible that the first spacer layer 16a, the second spacer layer 16b, and the third spacer layer 16c each include material different from those described above, provided that they include at least two different materials.

As mentioned above, the dummy gate structures 20 and 30 include the same components as the dummy gate structure 10 does; furthermore, the spacers 26 and 36 include the same components as the spacer 16 does.

In this embodiment, recesses 23a are formed in region 2 of the substrate 100, and a stress-generating material is filled into the recesses 23a to form stress-generating layers 23. For an N-doped region, the stress-generating material includes SiGe. Specifically, each of the stress-generating layers 23 may be composed of an un-doped SiGe layer, a doped SiGe layer (i.e., the source or drain of the PMOS), and a silicon layer stacked in sequence (not shown). Salicide layers 28 then are formed respectively in the stress-generating layers 23 through the deposition of a metal layer and the reaction between the metal layer and the silicon layer by at least an anneal process. Meanwhile, no stress-generating layer is formed in the region 3, and accordingly, salicide layers 38 are formed in the substrate 100. The metal material used for the formation of the salicide layers 28 and 38 may include Ti, Ta, W, Co, Pt, Pd or, Ni. In another embodiment, the region 2 may be a P-doped region in which an NMOS can be formed, and the stress-generating layer 23 may include SiP or SiC in such an embodiment.

During the formation of the salicide layers 28 and 38, the region 1 is covered by a salicide block (SAB) layer 19 (as shown in FIG. 1A) and thus may be referred to as an "SAB area." The salicide block layer 19 may include silicon nitride. Further, a barrier layer 17 which may include silicon oxide lies between the salicide block layer 19 and the substrate 100, covering the dummy gate structure 10 and the spacer 16.

Furthermore, source and drain regions 39 may be formed in the region 3. Similarly, source and drain regions may be formed in the region 2.

The elements shown in FIG. 1A, including the isolation structure 102, the dummy gate structures 10, 20, and 30, the spacers 16, 26, and 36, the stress-generating layers 23, the source and drain regions 39, the salicide layers 28 and 38, the barrier layer 17, and the salicide block layer 19, are all well-understood in the relevant field and can be formed by any conventional method. Fabrication details are thus omitted for a concise description.

Figure 1B:
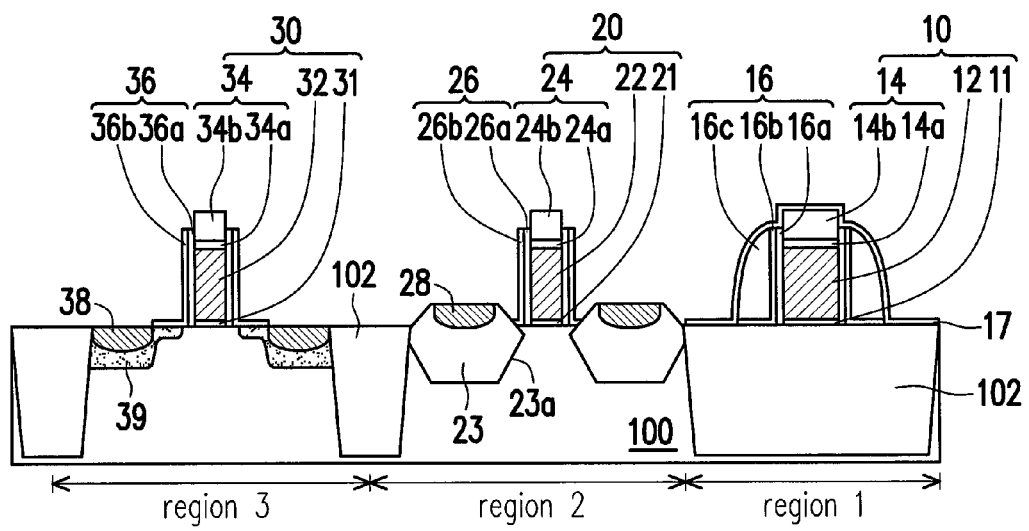

Referring to FIG. 1B, the salicide block layer 19, as well as the third spacer layers 26c and 36c, are removed by, for example, a wet etch process.

Figure 1C:
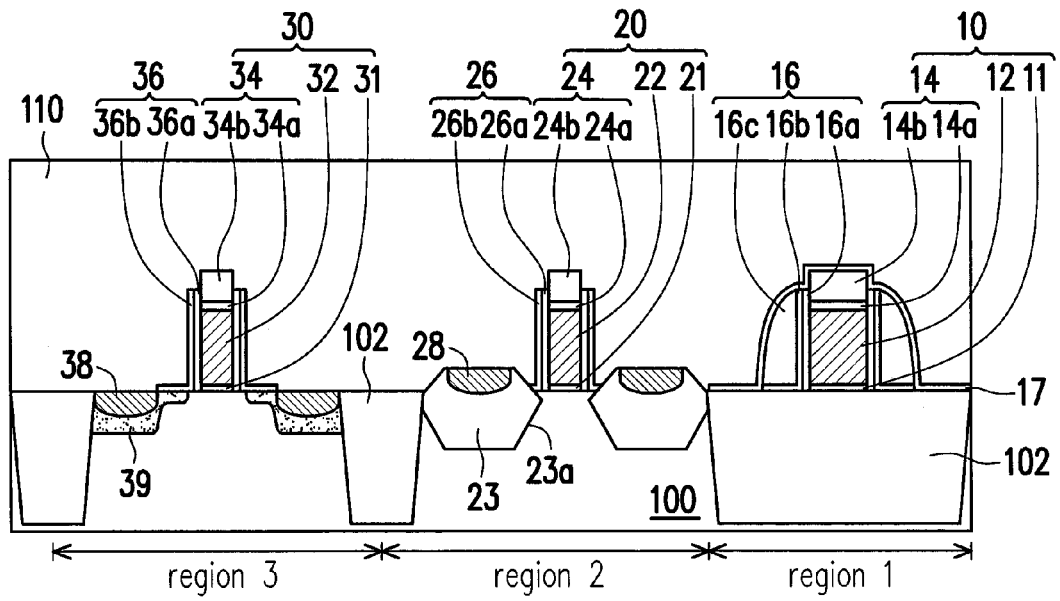

Referring to FIG. 1C, a mask layer 110 is formed on the substrate 100 to cover the region 1, the region 2, and the region 3. The mask layer may include photoresist material.

Figure 1D:
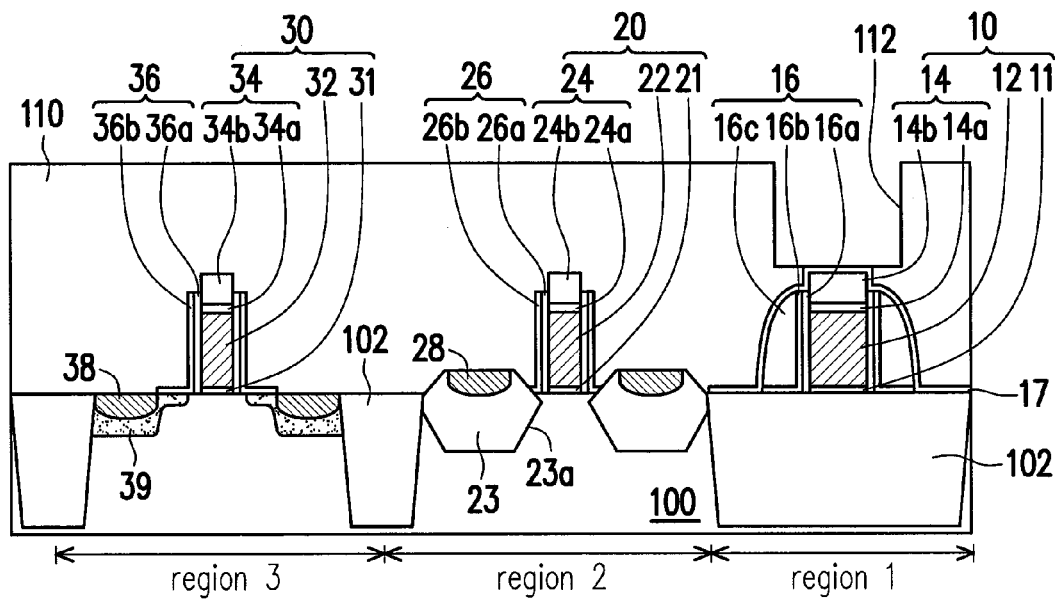

Referring to FIG. 1D, an opening 112 aligned with the second hard mask layer 14b is formed in the mask layer 110 to expose the corresponding portion of the barrier layer 17. The opening 112 may be formed by, for example, a photolithography process including an exposure step and a development step.

Figure 1E:
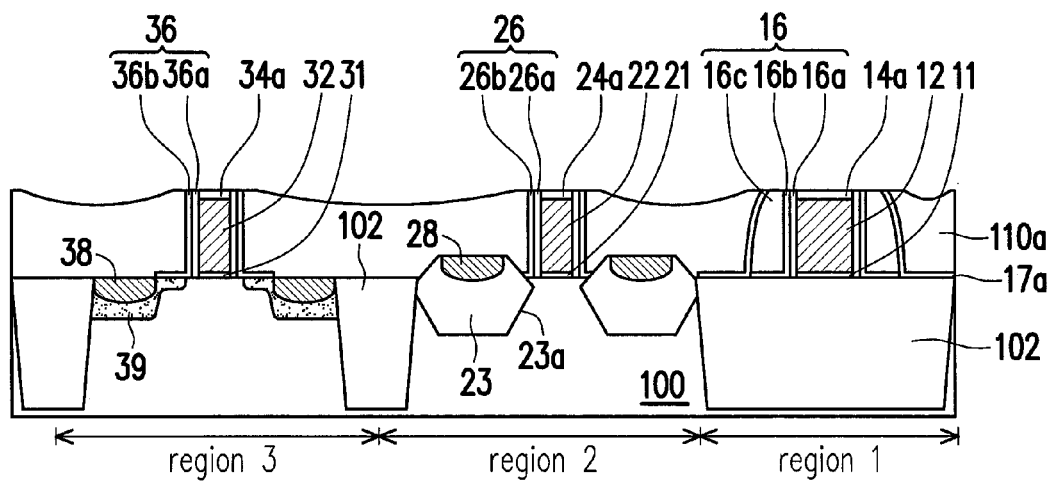

Referring to FIG. 1E, a portion of the mask layer 110, as well as the "corresponding portion" of the barrier layer 17, the second hard mask layers 14b, 24b, and 34b are removed by, for example, a dry etch process, leaving the remaining portion 110a of the mask layer 110 and the remaining portion 17a of the barrier layer 17 and exposing the hard mask layers 14a, 24a, and 34a.

Figure 1F:
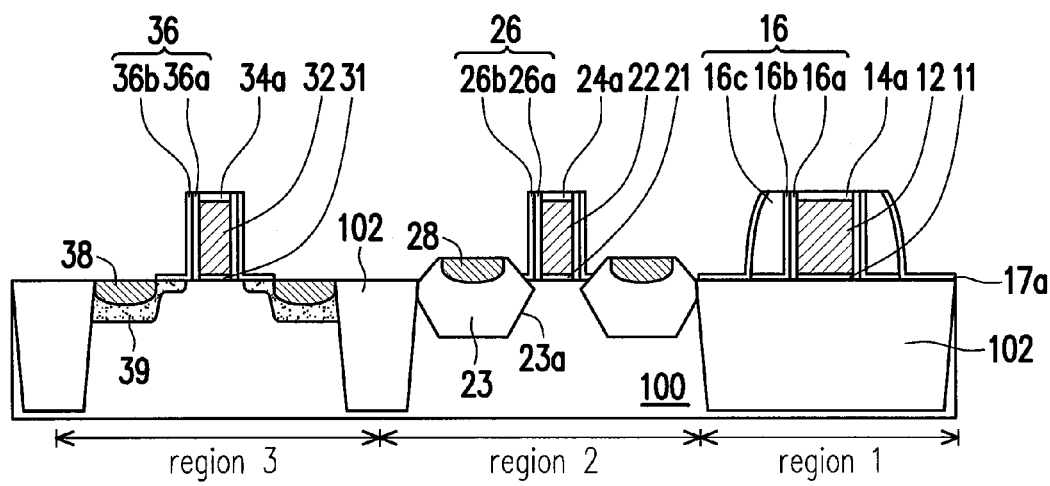

Referring to FIG. 1F, the remaining portion 110a of the mask layer 110 is removed. In an embodiment in which the mask layer 110 is a photoresist layer, the photoresist strip process may be a dry etch process such as an oxygen plasma ashing process. Afterwards, the remaining photoresist may be removed by a wet etch process.

Figure 1G:
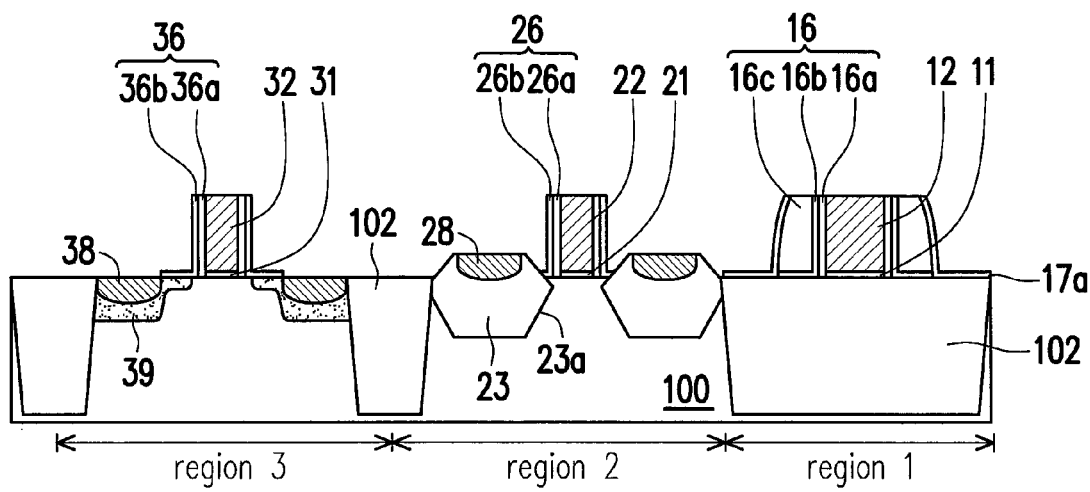

Referring to FIG. 1G, a dry etch process is performed to remove the first hard mask layers 14a, 24a, and 34a. Meanwhile, the spacers 16, 26, and 36 are partially etched, resulting a planar morphology at the top portions of the dummy gates 12, 22, and 32, and the spacers 16, 26, and 36. In an embodiment, an etch condition is controlled so that the remove rates (etch rates) of the first hard mask layers 14a, 24a, and 34a and the spacers 16, 26, and 36 are substantially the same. The etch condition, for example, may be the flow rate of etchants in the dry etch process.

In an embodiment, the dry etch process is a plasma etch process including at least the following three steps: 1) a plasma generation step, 2) an etch step, and 3) a sublimation step.

Gas sources used in the dry etch process include a fluorine-containing gas (e.g. $NF_3$) source and a hydrogen-containing gas (e.g. $NH_3$ or $H_2$) source. $NF_3$ and $H_2$ are introduced into the plasma chamber to generate a plasma including HF radical (HF*) and $NH_4F$. The reaction of the plasma generation step proceeds as follows (note the reaction equation is not balanced and is presented only for illustrating purpose):

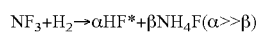

$$NF_3 + H_2 \rightarrow \alpha HF^* + \beta NH_4F (\alpha \gg \beta)$$

Then, in the etch step, the species contained in the plasma react respectively with the materials of the first hard mask layers 14a, 24a, and 34a and the spacers 16, 26, and 36 (i.e., silicon nitride ($Si_3N_4$) and silicon oxide ($SiO_2$)) to form by-product $(NH_4)_2SiF_6$. In this step, the by-product $(NH_4)_2SiF_6$ should remain in its solid phase for the purpose which will be described in the following paragraph. Consequently, the temperature near the substrate 100 should be relatively low (e.g., less than 50° C.). Other plasma parameters (e.g., pressure, plasma frequency, and plasma power) can also be suitably adjusted so that the removal rates of the silicon nitride and silicon oxide are approximately the same. The result is the uniform removal of the hard mask layers 14a, 24a, and 34a and a portion of spacers 16, 26, and 36. The reactions of the etch step are summarized in the following reaction equations (not balanced):

$$HF^* + Si_3N_4 \rightarrow (NH_4)_2SiF_6$$

$$NH_4F + SiO_2 \rightarrow (NH_4)_2SiF_6 + H_2O$$

Then, in the sublimation step, the by-product $(NH_4)_2SiF_6$ is sublimed in a higher temperature as compared to that of the etch step (e.g., greater than 100° C.). In an embodiment, this temperature difference can be realized by reducing the distance between the substrate 100 and the heated gas delivery pate in the plasma chamber. The reaction of the sublimation step is summarized in the following reaction equation (not balanced):

$$(NH_4)_2SiF_{6(solid)} \rightarrow SiF_{4(g)} + NH_{3(g)} + HF_{(g)}$$

Figure 2:
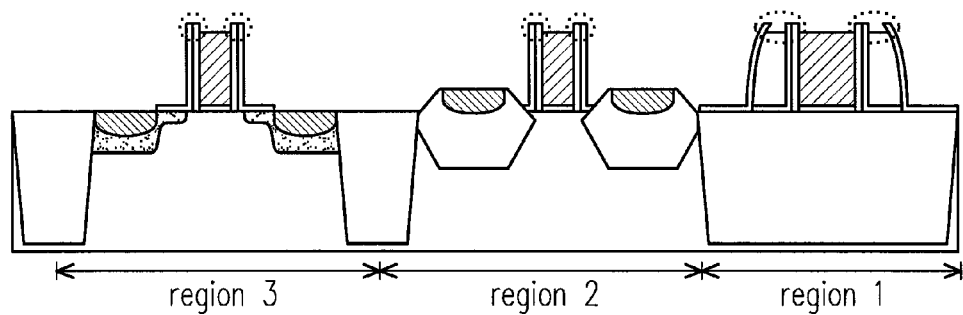
FIG. 2 is a schematic cross-section view of a semiconductor device after the first hard mask layers thereof are removed by a wet etch process.

The use of a plasma etch process utilizing $NF_3$ and $H_2$ as the etchants to remove the first hard mask layers 14a, 24a, and 34a provides a particular advantage that the top portion of the dummy gate 12, 22, and 32 and spacers 16, 26, and 36 exhibit a flat morphology. Referring to FIG. 2 for another example, of which all features are identical to the as-described embodiment except that the first hard mask layers are removed by a wet etch process, due to the etch selectivity of different materials, an overhang as marked by the dotted circle is created after the first hard mask layers are removed. The overhang structure may bring detrimental effects such as point discharge phenomenon.

The above reaction equations are provided for an embodiment in which the first hard mask layers 14a, 24a, and 34a and the spacers 16, 26, and 36 include silicon oxide and silicon nitride. The present invention, however, is not limited thereto. The first hard mask layers 14a, 24a, and 34a and the spacers 16, 26, and 36 can include other materials, and the "flat" morphology can be still achieved by changing the species or modifying flow ratio of the etchants.

Figure 1H:
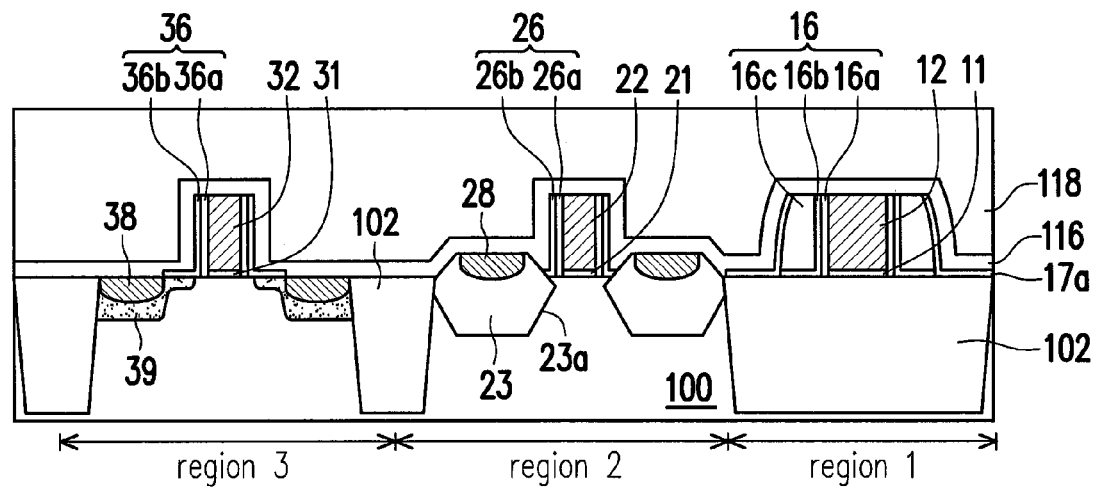

Referring to FIG. 1H, a stress layer 116 and a dielectric layer 118 are formed sequentially on the substrate 100 to cover the region 1, region 2, and region 3. The stress layer 116 may be formed by a chemical vapor deposition process and may include silicon nitride. The dielectric layer 118, sometimes referred to as the "interlayer dielectric layer (ILD)" may also be formed by a chemical vapor deposition process and may include silicon oxide.

Figure 1I:
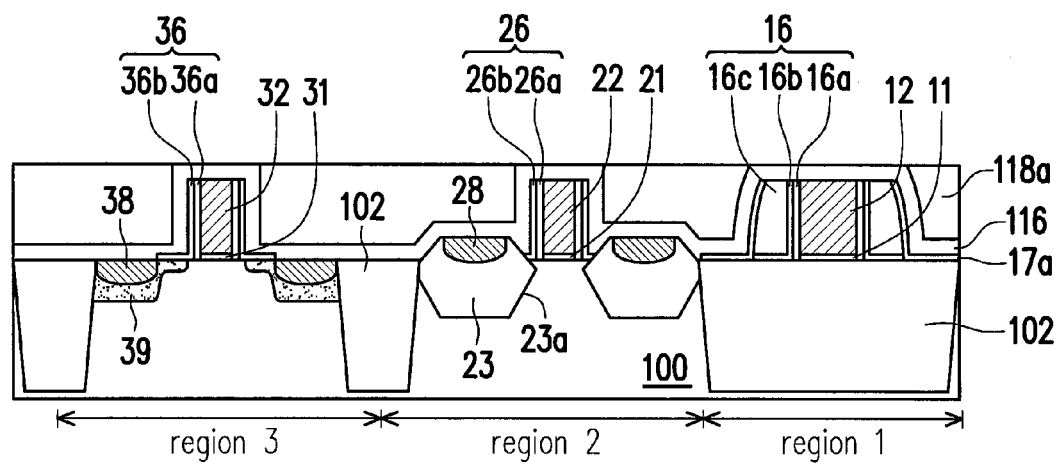

Referring to FIG. 1I, a chemical mechanical polish (CMP) process is performed to remove a portion of the dielectric layer 118. The CMP process stops at the stress layer 116. Afterwards, a replacement metal gate (RMG) process of which the main scheme is to replace each of the dummy gates 12, 22, and 32 with a metal gate is performed. The RMG process is familiar to persons having ordinary skills in the art, and the details are omitted here for brevity.

In most of the as-described embodiments, the region 2 has been described as an N-doped region in which a PMOS can be formed, and the region 3 a P-doped region in which an NMOS can be formed, wherein there is no stress-generating layer in the region 3, but the present invention is not limited thereto. In other embodiments, the region 2 may be a P-doped region and the region 3 may be an N-doped region, and both of them can have a stress-generating layer formed therein.

Accordingly, the present invention provides a method of fabricating a semiconductor device, in which a hard mask layer and a portion of the spacer adjacent thereto are removed by a specific dry etch process which can be adjusted to provide a uniform remove rates for different materials, thus resulting a better morphology and, in turn, an improved performance.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a semiconductor device, comprising:
   forming a dummy gate structure on a substrate, wherein the dummy gate structure comprises a dummy gate and a stacked hard mask, the stacked hard mask comprising, from bottom to top, a first hard mask layer and a second hard mask layer;
   forming a spacer on a sidewall of the dummy gate structure;
   forming a mask layer on the substrate;
   forming an opening in the mask layer, wherein the opening corresponds to the second hard mask layer;
   removing the second hard mask layer;
   removing the mask layer; and
   performing a dry etch process to remove the first hard mask layer, wherein the dry etch process uses $NF_3$ and $H_2$ as etchants.

2. The method of claim 1, wherein a flow ratio of $NF_3$ and $H_2$ is adjusted in the dry etch process so that a remove rate of the first hard mask and a remove rate of the spacer are substantially the same.

3. The method of claim 1, wherein the first hard mask layer comprises silicon nitride.

4. The method of claim 1, wherein the dry etch process comprises a first step and a second step, and the temperature of the second step is higher than the temperature of the first step.

5. The method of claim 4, wherein the temperature of the first step is less than 50° C. and the temperature of the second step is higher than 100° C.

6. The method of claim 1, wherein the mask layer comprises photoresist.

7. A method of fabricating a semiconductor device, comprising:
   providing a substrate comprising a first region and a second region;
   forming a first dummy gate structure on the first region of the substrate and forming a second dummy gate structure on the second region of the substrate, wherein the first dummy gate structure and the second dummy gate structure each comprise a dummy gate and a stacked hard mask, and the stacked hard mask comprises, from bottom to top, a first hard mask layer and a second hard mask layer;

forming a first spacer on a sidewall of the first dummy gate structure and a second spacer on a sidewall of the second dummy gate structure;

forming a mask layer on the substrate to cover the first region and the second region;

forming an opening in the mask layer, wherein the opening corresponds to the second hard mask layer of the first dummy gate structure;

removing a portion of the mask layer, the second hard mask layer of the first dummy gate structure and the second hard mask layer of the second dummy gate structure;

removing the mask layer; and performing a dry etch process to remove the first hard mask layer of the first dummy gate structure and the first hard mask layer of the second dummy gate structure, wherein the dry etch process uses $NF_3$ and $H_2$ as etchants.

8. The method of claim 7, wherein a flow ratio of $NF_3$ and $H_2$ is adjusted in the dry etch process so that a remove rate of the first hard mask and a remove rate of the spacer are substantially the same.

9. The method of claim 7, wherein before the formation of the mask layer, the method further comprises:

forming a salicide block layer (SAB) on the first region of the substrate;

forming a salicide layer in the second region of the substrate; and removing the salicide block layer and a portion of the second spacer.

10. The method of claim 7, wherein the first hard mask layer comprises silicon nitride.

11. The method of claim 7, wherein the dry etch process comprises a first step and a second step, and the temperature of the second step is higher than the temperature of the first step.

12. The method of claim 11, wherein the temperature of the first step is less than 50° C. and the temperature of the second step is higher than 100° C.

13. The method of claim 7, wherein the mask layer comprises photoresist.

14. The method of claim 6, wherein the second region is an N-doped region.

15. The method of claim 14, further comprising forming a stress-generating layer comprising SiGe in the second region.

16. The method of claim 6, wherein the second region is a P-doped region.

17. The method of claim 16, further comprising forming a stress-generating layer comprising SiP or SiC in the second region.

* * * * *